(12) United States Patent
Xu et al.

(10) Patent No.: US 12,087,191 B2
(45) Date of Patent: Sep. 10, 2024

(54) CIRCUIT BOARD, DISPLAY MODULE, AND DISPLAY DEVICE

(71) Applicant: Wuhan Tianma Micro-Electronics Co., Ltd., Wuhan (CN)

(72) Inventors: Ning Xu, Wuhan (CN); Xiong Yang, Wuhan (CN); Zhihua Yu, Wuhan (CN)

(73) Assignee: Wuhan Tianma Micro-Electronics Co., Wuhan (CN)

( * ) Notice: Subject to any disclaimer, the term of this patent is extended or adjusted under 35 U.S.C. 154(b) by 71 days.

(21) Appl. No.: 17/681,518

(22) Filed: Feb. 25, 2022

(65) Prior Publication Data
US 2023/0206793 A1  Jun. 29, 2023

(30) Foreign Application Priority Data
Dec. 28, 2021  (CN) .......................... 202111622646.X

(51) Int. Cl.
G09G 3/00  (2006.01)
(52) U.S. Cl.
CPC ......... *G09G 3/006* (2013.01); *G09G 2330/12* (2013.01)
(58) Field of Classification Search
CPC ..................... G09G 3/006; G09G 2330/12
See application file for complete search history.

(56) References Cited

U.S. PATENT DOCUMENTS

| | | | | | |
|---|---|---|---|---|---|
| 2002/0180026 | A1* | 12/2002 | Liu | .................... | G01R 31/2884 257/773 |
| 2006/0109014 | A1* | 5/2006 | Chao | .................. | G01R 31/2884 324/762.05 |
| 2007/0085962 | A1* | 4/2007 | Yoshioka | ............ | G02F 1/13452 349/149 |
| 2012/0248439 | A1* | 10/2012 | Lee | .................... | H01L 23/49838 257/777 |
| 2016/0103349 | A1* | 4/2016 | Park | ...................... | G02F 1/1309 349/96 |
| 2016/0178666 | A1* | 6/2016 | Oh | ...................... | G01R 31/2891 324/750.24 |
| 2017/0125314 | A1* | 5/2017 | Lim | ........................ | H01L 23/66 |
| 2019/0064239 | A1* | 2/2019 | Lee | ........................ | G01R 31/70 |
| 2022/0173026 | A1* | 6/2022 | Yang | ...................... | H01L 22/32 |
| 2022/0328599 | A1* | 10/2022 | Zhang | ..................... | G06F 3/044 |

FOREIGN PATENT DOCUMENTS

| | | |
|---|---|---|
| CN | 105702188 A | 6/2016 |
| CN | 106658947 A | 5/2017 |
| CN | 107632441 A | 1/2018 |
| CN | 111316762 A | 6/2020 |
| JP | 2002076642 A | 3/2002 |

* cited by examiner

*Primary Examiner* — David Tung
(74) *Attorney, Agent, or Firm* — Anova Law Group, PLLC

(57) ABSTRACT

A circuit board, a display module, and a display device are provided. The circuit board includes: a base substrate including a first surface and a second surface opposite to each other; bonding pads on the first surface; test pads electrically connected to the bonding pads and disposed on the second surface; a test auxiliary structure on the second surface; and a metal layer on the second surface. The test auxiliary structure overlaps with the test pads along a first direction which is a direction perpendicular to the first surface and the second surface of the base substrate; and the metal layer includes a metal structure for transmitting a first signal and the test auxiliary structure is insulated from the metal structure.

6 Claims, 12 Drawing Sheets

CIRCUIT BOARD, DISPLAY MODULE, AND DISPLAY DEVICE

CROSS-REFERENCE TO RELATED APPLICATION

This application claims the priority of Chinese Patent Application No. 202111622646.X, filed on Dec. 28, 2021, the content of which is incorporated herein by reference in its entirety.

TECHNICAL FIELD

The present disclosure generally relates to the field of display technology and, more particularly, relates to a circuit board, a display module, and a display device.

BACKGROUND

From the era of cathode ray tube (CRT) to the era of liquid crystal, and now to the era of organic light-emitting diode (OLED), the display industry has undergone decades of development and has evolved significantly. The display industry has been closely related to our lives. From traditional mobile phones, tablets, TVs, and PCs, to current electronic devices such as smart wearable devices and virtual reality devices, display technology is inseparable.

A display device includes a display panel and a flexible circuit board bound to the display panel. The bonding impedance of the flexible circuit board is an important factor affecting the image display quality. If the bond impedance is too large, it may cause an abnormal image display. Therefore, in both production operations and experimental analysis of the display device, it is necessary to test the bonding impedance of the flexible circuit board. A common test method is to use a probe to penetrate to the test point. But there is a phenomenon that the probe penetrates through the test point and is electrically connected to other charged film layers, which seriously affects the accuracy of the bonding impedance test.

SUMMARY

One aspect of the present disclosure provides a circuit board. The circuit board includes: a base substrate including a first surface and a second surface opposite to each other; bonding pads on the first surface; test pads electrically connected to the bonding pads and disposed on the second surface; a test auxiliary structure on the second surface; and a metal layer on the second surface. The test auxiliary structure overlaps with the test pads along a first direction which is a direction perpendicular to the first surface and the second surface of the base substrate; and the metal layer includes a metal structure for transmitting a first signal and the test auxiliary structure is insulated from the metal structure.

Another aspect of the present disclosure provides a display module. The display module includes a display panel and a circuit board. The circuit board includes: a base substrate including a first surface and a second surface opposite to each other; bonding pads on the first surface; test pads electrically connected to the bonding pads and disposed on the second surface; a test auxiliary structure on the second surface; and the metal layer on the second surface. The test auxiliary structure overlaps with the test pads along a first direction which is a direction perpendicular to the first surface and the second surface of the base substrate; and the metal layer includes a metal structure for transmitting a first signal and the test auxiliary structure is insulated from the metal structure. The display panel includes a bonding area. The circuit board is bonded to the bonding area through the bonding pads.

Another aspect of the present disclosure provides a display device. The display device includes a display module. The display module includes a display panel and a circuit board. The circuit board includes: a base substrate including a first surface and a second surface opposite to each other; bonding pads on the first surface; test pads electrically connected to the bonding pads and disposed on the second surface; a test auxiliary structure on the second surface; and a metal layer on the second surface. The test auxiliary structure overlaps with the test pads along a first direction which is a direction perpendicular to the first surface and the second surface of the base substrate; and the metal layer includes a metal structure for transmitting a first signal and the test auxiliary structure is insulated from the metal structure. The display panel includes a bonding area. The circuit board is bonded to the bonding area through the bonding pads.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
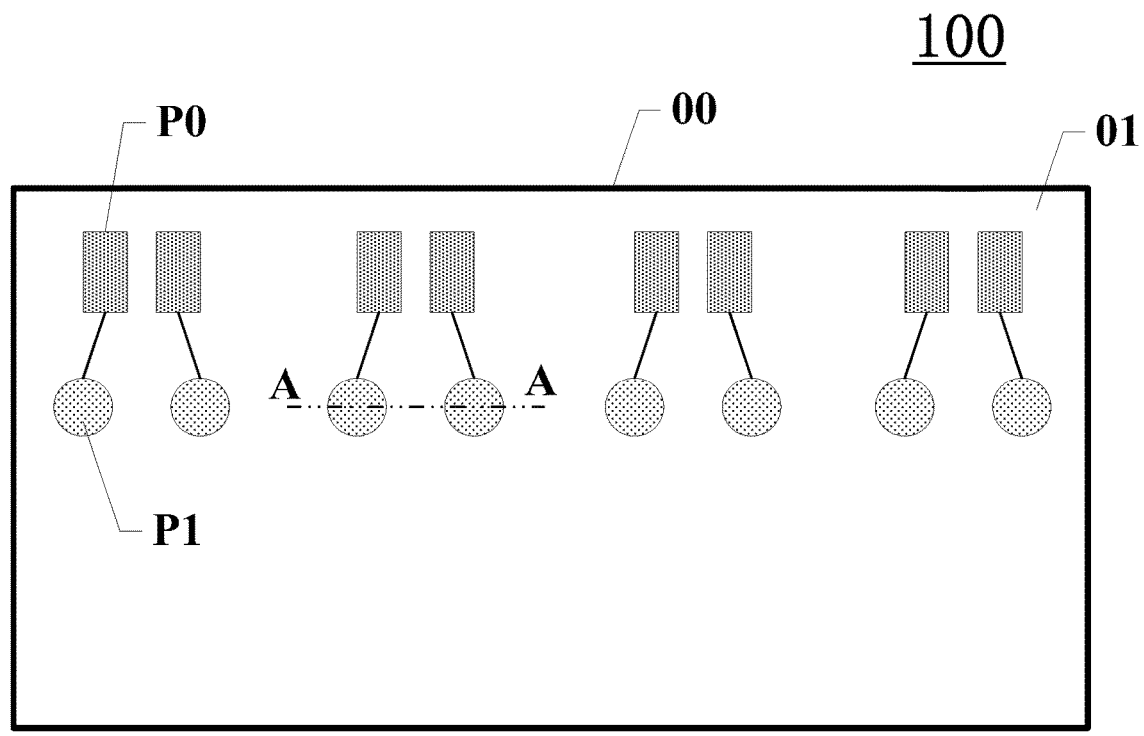
FIG. 1 illustrates a top view of a first surface of an exemplary circuit board consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

In the present disclosure, relational terms such as first and second are only used to distinguish one entity or operation from another entity or operation, and do not necessarily require or imply any such actual relationship between these entities or operations or order. Moreover, the terms "including", "comprising" or any other variants thereof are intended to cover non-exclusive inclusion, such that a process, method, article, or device that includes a series of elements includes not only those elements, but also those that are not explicitly listed or also include elements inherent to this process, method, article or equipment. If there are no more restrictions, the elements defined by the sentence "including . . . " do not exclude the existence of other same elements in the process, method, article, or equipment that includes the elements.

It should be understood that when describing the structure of a component, when a layer or area is referred to as being "on" or "above" another layer or another area, the layer or area may be directly on the other layer or area, or indirectly on the other layer or area, for example, layers/components between the layer or area and another layer or another area. And, for example, when the component is reversed, the layer or area may be "below" or "under" the other layer or area.

In the present disclosure, the term "electrical connection" refers to that two components are directly electrically connected with each other, or the two components are electrically connected via one or more other components.

Figure 2:
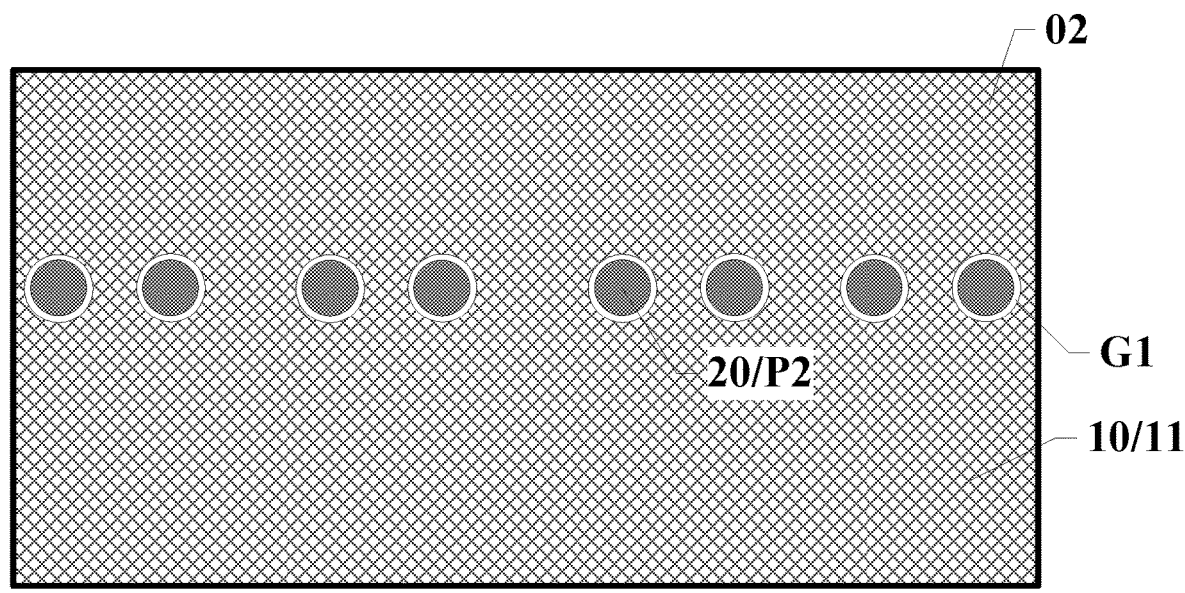
FIG. 2 illustrates a top view of a second surface of an exemplary circuit board consistent with various disclosed embodiments in the present disclosure.
Figure 3:
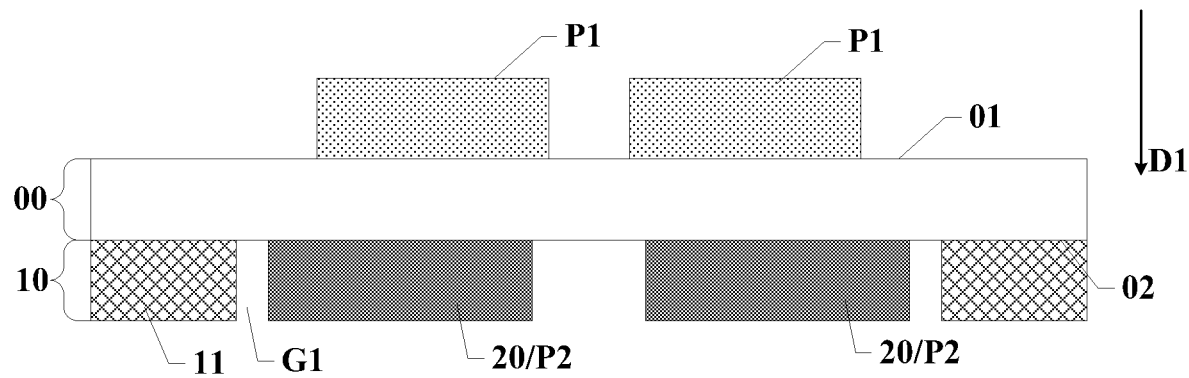
FIG. 3 illustrates a cross-section view of the circuit board along an A-A direction in FIG. 1, consistent with various disclosed embodiments in the present disclosure.

The present disclosure provides a circuit board. In one embodiment, FIG. 1 illustrates a top view of a first surface of the circuit board, FIG. 2 illustrates a top view of a second surface of the circuit board, and FIG. 3 illustrates a cross-sectional view of the circuit board in FIG. 1 along an AA direction. As shown in FIGS. 1-3, in one embodiment, the circuit board 100 may include a base substrate 00, bonding pads P0, test pads P1, a test auxiliary structure 20, and a metal layer 10.

The base substrate 00 may include a first surface 01 and a second surface 02 opposite to the first surface 01. The bonding pads P0 may be disposed on the first surface 01. The test pads P1 may be electrically connected to the bonding pad P0 and disposed on the first surface 01. The test auxiliary structure 20 may be disposed on the second surface 02. Along a first direction D1, the test pads P1 may overlap the test auxiliary structure 20. The first direction D1 may be a direction perpendicular to the first surface 01 and the second surface 02 of the base substrate 00. The metal layer 10 may be disposed on the second surface 02 and may include a metal structure 11. The metal structure 11 may transmit a first signal and the test auxiliary structure 20 may be insulated from the metal structure 11.

For description purposes only, the embodiment in FIG. 1 where the first surface 01 of the circuit board 100 is provided with eight bonding pads P0 and eight test pads P1 is used as an example to illustrate the present disclosure, and does not limit the scope of the present disclosure. In various embodiments, the quantity of the bonding pads P0 and the test pads P1 may be configured according to actual needs. Also, the embodiment in FIG. 1 where the bonding pads P0 are rectangular and the test pads P1 are circular is used as an example to illustrate the present disclosure, and does not limit the scope of the present disclosure. In various embodiments, the bonding pads P0 and the test pads P1 may be configured to other shapes according to actual needs. Further, the embodiment with a relative position relationship between the test auxiliary structure 20 and the metal layer 10 on the second surface 02 is used as an example to illustrate the present disclosure, and does not limit the shape and quantity of the test auxiliary structure 20, and the scope of the present disclosure.

In the circuit board 100 provided by the embodiment of the present disclosure, the first surface 01 of the base substrate 00 may be provided with the bond pads P0 and the test pads P1 electrically connected to the bond pads P0. Optionally, the bond pads P0 may be used for bonding with the display panel to form an electrical connection with the display panel. The bonding impedance of the circuit board on the display panel can be measured through the test pads P1. The bonding impedance of the circuit board on the display panel has a great influence on the performance of the display panel. Therefore, when bonding the circuit board on the display panel, it is particularly important to measure the bonding impedance on the circuit board.

In related technologies, a method for measuring the bonding impedance of the circuit board includes: inserting a probe to the test pads, and measuring the bonding impedance through the probe. When the probe is pierced into the test pads, since the probe is relatively sharp, there is a risk of piercing both the test pad and the base substrate. When the probe pierces the base substrate, the probe will contact the metal layer on the second surface of the base substrate. Correspondingly, the signal transmitted by the metal layer will affect the test signal of the probe, thus affecting the detection accuracy of the bonding impedance.

In the present disclosure, the metal layer 10 and the test auxiliary structure 20 insulated from the metal layer 10 may be disposed on the second surface 02 of the base substrate 00. Along the first direction D1, the test auxiliary structure 20 and the test pads P1 may overlap, that is, an orthographic projection of the test auxiliary structure 20 to the plane of the base substrate 00 may overlap an orthographic projection of the test pads P1 to the plane of the base substrate 00. When inserting the probe to the test pads P1 for testing the bonding impedance of the circuit board and the probe pierces through the test pads P1 and the base substrate 00 to contact the test auxiliary structure 20, the electrical signal on the metal structure 11 may not be transmitted to the probe and may not affect the test impedance, since the test auxiliary structure 20 may be disposed directly under the test pads P1 and may be insulated from the metal structure 11 on the metal layer 10. Therefore, by improving the structure of the circuit board in the present disclosure, the test accuracy of the bonding impedance of the circuit board when the circuit board is bound to the display panel may be improved.

As shown in FIG. 3, in one embodiment, the test auxiliary structure 20 and the metal layer 10 may be disposed in a same layer.

In one embodiment shown in FIG. 3, the test auxiliary structure 20 and the metal layer 10 may be arranged in the same layer on the second surface 02 of the base substrate 00. When the test auxiliary structure 20 is introduced into the circuit board to improve the test accuracy of the bonding impedance of the circuit board, the test auxiliary structure 20 and the metal layer 10 may be arranged in the same layer, that is, a space film layer where the metal layer 10 is located may be used to form the test auxiliary structure 20. Correspondingly, there may be no need to introduce a new film layer structure, the overall film thickness of the circuit board may not be increased, to meet the thinning requirements of the circuit board.

As shown in FIG. 2 and FIG. 3, in one embodiment, the test auxiliary structure 20 may include auxiliary pads P2. First gap G1 may be formed between the auxiliary pads P2 and the metal structure 11.

In the embodiment shown in FIG. 2 and FIG. 3, the test auxiliary structure 20 may include the auxiliary pads P2, and the first gap G1 may be formed between the auxiliary pads P2 and the metal structure 11 to insulate the auxiliary pads P2 from the metal structure 11. Correspondingly, when inserting the probe to the test pads P1 for testing the bonding impedance of the circuit board and the probe pierces through the test pads P1 and the base substrate 00, the probe may contact the auxiliary pads P2 and the electrical signal on the metal structure 11 may not be transmitted to the probe and may not affect the test impedance, since the auxiliary pads P2 may be insulated from the metal structure 11 on the metal layer 10. Therefore, the test accuracy of the bonding impedance of the circuit board when the circuit board is bound to the display panel may be improved.

In one embodiment shown in FIG. 1 and FIG. 3, the test pads P1 in the circuit board 100 may include at least two test pads P1 insulated from each other, and the auxiliary pads P2 of the test auxiliary structure 20 may include at least two auxiliary pads P2 insulated from each other. The at least two test pads P1 and the at least two auxiliary pads P2 may be disposed in a one-to-one correspondence.

When the circuit board is bonded to the display panel and the bonding impedance of the circuit board is tested, the at least two test pads P1 may be introduced in the circuit board, and two probes may be inserted into the two test pads P1 respectively. The bonding impedance of the circuit board may be obtained by measuring the impedance between the two test pads P1. When the at least two test pads P1 are provided on the first surface 01 of the circuit board, the auxiliary pads P2 with the same number of the test pads P1 may be arranged on the second surface 02 of the circuit board. The at least two test pads P1 and the at least two auxiliary pads P2 may be disposed in a one-to-one correspondence. That is, along the first direction D1, the orthographic projection of one of the at least two auxiliary pads P2 to the base substrate 00 may overlap with the orthographic projection of a corresponding one of the at least two test pads P1 to the base substrate 00. By providing each of the at least two test pads P1 with a corresponding one of the at least two auxiliary pad P2 below, when the probes pierce through the base substrate 00, the at least two test pad P1 instead of the metal structure 11 may contact the probes, which is beneficial to improve the test accuracy of the bonding impedance. Further, the at least two auxiliary pads P2 may be insulated from each other. When the at least two auxiliary pads P2 are electrically connected, if both of the two probes pierce through the base substrate 00 and connect to the at least two auxiliary pads P2 that are electrically connected to each other, the two probes may be short-circuited, seriously affecting the test accuracy of the bonding impedance. Therefore, in the present disclosure, the at least two auxiliary pads P2 may be insulated from each other. Correspondingly, when two probes pierce through the base substrate 00 and make contact with the at least two auxiliary pads P2, since the at least two auxiliary pads P2 are insulated from each other, the two probes may be also insulated from each other and may not affect the test results.

Figure 4:
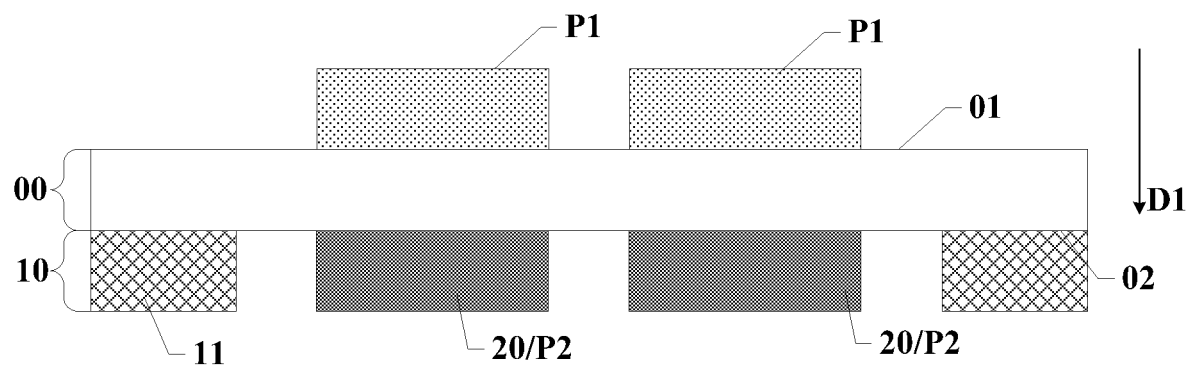
FIG. 4 illustrates another cross-section view of the circuit board along the A-A direction in FIG. 1, consistent with various disclosed embodiments in the present disclosure.
Figure 5:
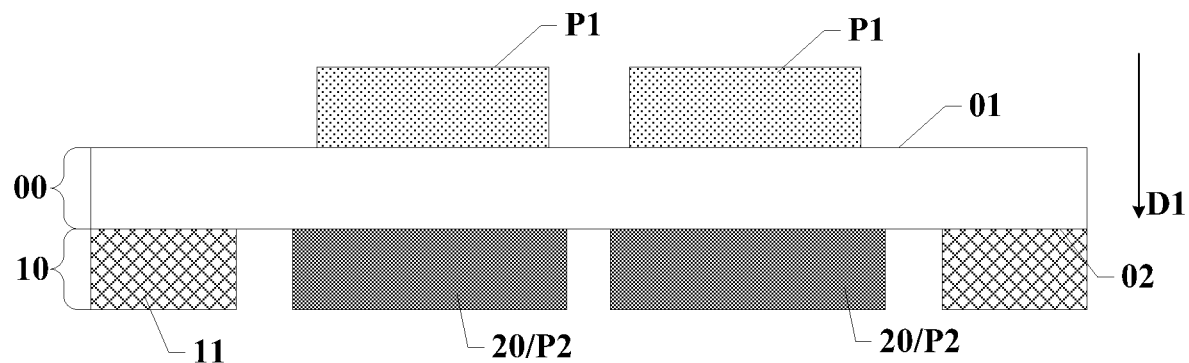
FIG. 5 illustrates another cross-section view of the circuit board along the A-A direction in FIG. 1, consistent with various disclosed embodiments in the present disclosure.

FIG. 3 illustrates an implementation where the orthographic projection of one of the at least two auxiliary pads P2 to the base substrate 00 may overlap with the orthographic projection of a corresponding one of the at least two test pads P1 to the base substrate 00 along the first direction D1. For description purposes only, the embodiment in FIG. 3 is used as an example to illustrate the present disclosure and does not limit the scope of the present disclosure. In various embodiments, the position relationship between the at least two auxiliary pads P2 and the at least two test pads P1 may be configured to other suitable relationships. For example, FIG. 4 and FIG. 5 illustrate two other implementations. FIG. 4 and FIG. 5 illustrate two other cross-section views of the circuit board along the A-A direction in FIG. 1.

In the embodiments shown in FIG. 4 and FIG. 5, along the first direction D1, one of the test pads P1 may be located within the range defined by a corresponding one of the auxiliary pads P2. In other words, along the first direction D1, the orthographic projection of one of the test pads P1 to the plane of the base substrate 00 may be within the orthographic projection range of a corresponding one of the auxiliary pads P2 to the plane of the base substrate 00. This setting may be realized through two implementations.

In one implementation, as shown in FIG. 4, along the first direction D1, the orthographic projection of one of the test pads P1 to the plane of the base substrate 00 may coincide with the orthographic projection range of a corresponding one of the auxiliary pads P2 to the plane of the base substrate 00. Correspondingly, when inserting the probe to the test pads P1 for testing the bonding impedance of the circuit board and the probe pierces through the test pads P1 and the base substrate 00, the probe may accurately insert to the auxiliary pads P2 and may be prevented from contacting the metal structure 11. Therefore, the electrical connection between the probe and the metal structure 11 may be prevented from affecting the test of the bonding impedance.

In another implementation, as shown in FIG. 5, along the first direction D1, the orthographic projection of one of the test pads P1 to the plane of the base substrate 00 may be within the orthographic projection range of a corresponding one of the auxiliary pads P2 to the plane of the base substrate 00, and an area of the orthographic projection of one of the test pads P1 to the plane of the base substrate 00 may be smaller than an area of the orthographic projection of a corresponding one of the auxiliary pads P2 to the plane of the base substrate 00. Correspondingly, when inserting the probe to the test pads P1 for testing the bonding impedance of the circuit board and the probe pierces through the test pads P1 and the base substrate 00, even if the probe is not perpendicularly inserted to the test pads P1, only the auxiliary pads P2 may contact the probe when the probe arrives at the second surface 02 of the base substrate 00 since the area of the auxiliary pads P2 may be relatively large. Therefore, the electrical connection between the probe and the metal structure 11 may be prevented from affecting the test of the bonding impedance.

In one embodiment of the present disclosure, the auxiliary pads P2 may be floating. The floating of the auxiliary pads P2 may mean that the auxiliary pads P2 do not receive any electrical signal. Therefore, even if the probe pierces through the test pads P1 and the base substrate 00 to contact the auxiliary pads P2, the auxiliary pads P2 may not receive any electrical signals affecting the test signal. The test accuracy of the bonding impedance of the circuit board may be improved.

It should be noted that, in the embodiments shown in FIGS. 3 to 5, when the auxiliary pads P2 are disposed in the metal layer 10, FIGS. 3 to 5 use different fillings to distinguish the auxiliary pads P2 and the metal structure 11. The auxiliary pads P2 may be made of a material different from that of the metal structure 11. For example, the metal structure 11 may be made of copper foil, the auxiliary pads P2 may be made of other metal materials or insulating materials, which is not limited in the present disclosure.

Figure 6:
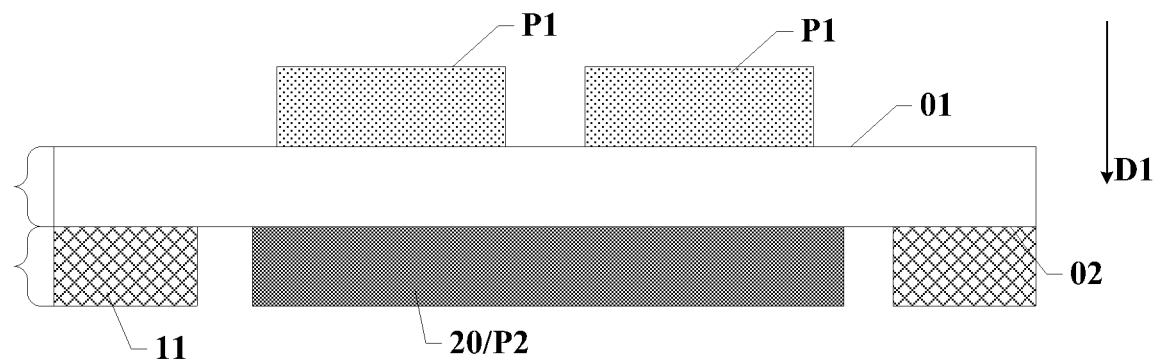
FIG. 6 illustrates another cross-section view of the circuit board along the A-A direction in FIG. 1, consistent with various disclosed embodiments in the present disclosure.

When the auxiliary pads P2 are made of metal materials, the two auxiliary pads P2 may be insulated from each other, for example, using the implementations shown in FIGS. 3 to 5. When the auxiliary pads P2 are made of insulating materials, two test pads P1 may correspond to only one auxiliary pad P2, for example, using the implementation shown in FIG. 6. Optionally, the orthographic projections of the two test pads P1 to the plane where the base substrate 00 is located may be located in the orthographic projection range of the same corresponding auxiliary pad P2 to the plane where the base substrate 00 is located. Correspondingly, even if the probe pierces through the test pad P1 and the base substrate 00 to contact the auxiliary pad P2, since the auxiliary pad P2 itself is made of insulating materials, the test results of the bonding impedance may not be affected.

Figure 7:
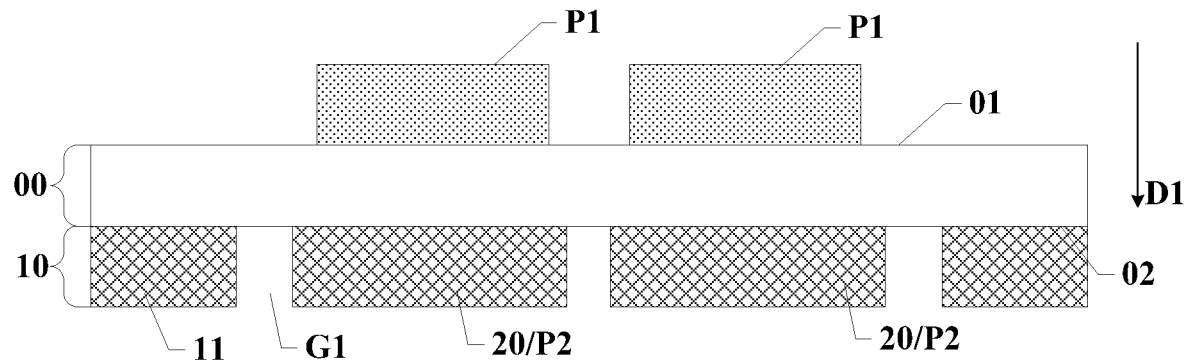
FIG. 7 illustrates another cross-section view of the circuit board along the A-A direction in FIG. 1, consistent with various disclosed embodiments in the present disclosure.

When the auxiliary pads P2 are made of a conductive material such as a metal material, in one embodiment, the auxiliary pads P2 and the metal structure 11 may be made of the same material. As shown in FIG. 7 which is another cross-sectional view of the circuit board in FIG. 1 along the AA direction, the same filling for the metal structure 11 and the auxiliary pads P2 is used to represent that they are made of the same material. For example, in one embodiment, the metal structure 11 may be made of copper foil, and the auxiliary pads P2 may also be made of copper foil. Optionally, in the process of fabricating the metal layer 10, a layer of a plane structure of copper foil may be firstly formed on the second surface 02 of the base substrate 00, and then etching may be performed on the copper foil to separate the metal structure 11 from the auxiliary pads P2 through first intervals G1, to avoid the electrical connection between the metal structure 11 and the auxiliary pads P2. Correspondingly, the metal structure 11 and the auxiliary pads P2 may be simultaneously formed by reusing the copper foil on the metal layer 10 without introducing new materials and new film layers on the circuit board. Optionally, the metal structure 11 may be grounded, and the auxiliary pads P2 may be left floating. This method may greatly simplify the manufacturing process after the auxiliary pads P2 are introduced into the circuit board, and thus may be beneficial to improve the production efficiency after the auxiliary pads P2 are introduced into the circuit board.

When the auxiliary pads P2 are made of a conductive material, for example, the same material as the metal structure 11 such as copper foil, according to the impedance calculation formula, the impedance of the auxiliary pads P2 may not exceed 1 $\mu\Omega$, while the bonding impedance of the circuit board is usually 0~20$\Omega$. When the two impedances are added together, the total impedance is approximately equal to the bonding impedance of the circuit board. That is to say, the impact of the resistance of the auxiliary pads P2 on the bonding impedance may be ignored, and the auxiliary pads P2 made of the conductive material may not affect the final test structure. Of course, in some other embodiments of the present disclosure, the auxiliary pads P2 may also be made of a material with a lower resistivity, to further improve the test accuracy of the bonding impedance after the auxiliary pads P2 are introduced.

When the auxiliary pads P2 are conductive structures, the positional relationship between the auxiliary pads P2 and the test pads P1 may also adopt other configurations. For example, FIG. 8 is another cross-sectional view of the circuit board in FIG. 1 along the AA cross-section provided by another embodiment of the present disclosure.

Figure 8:
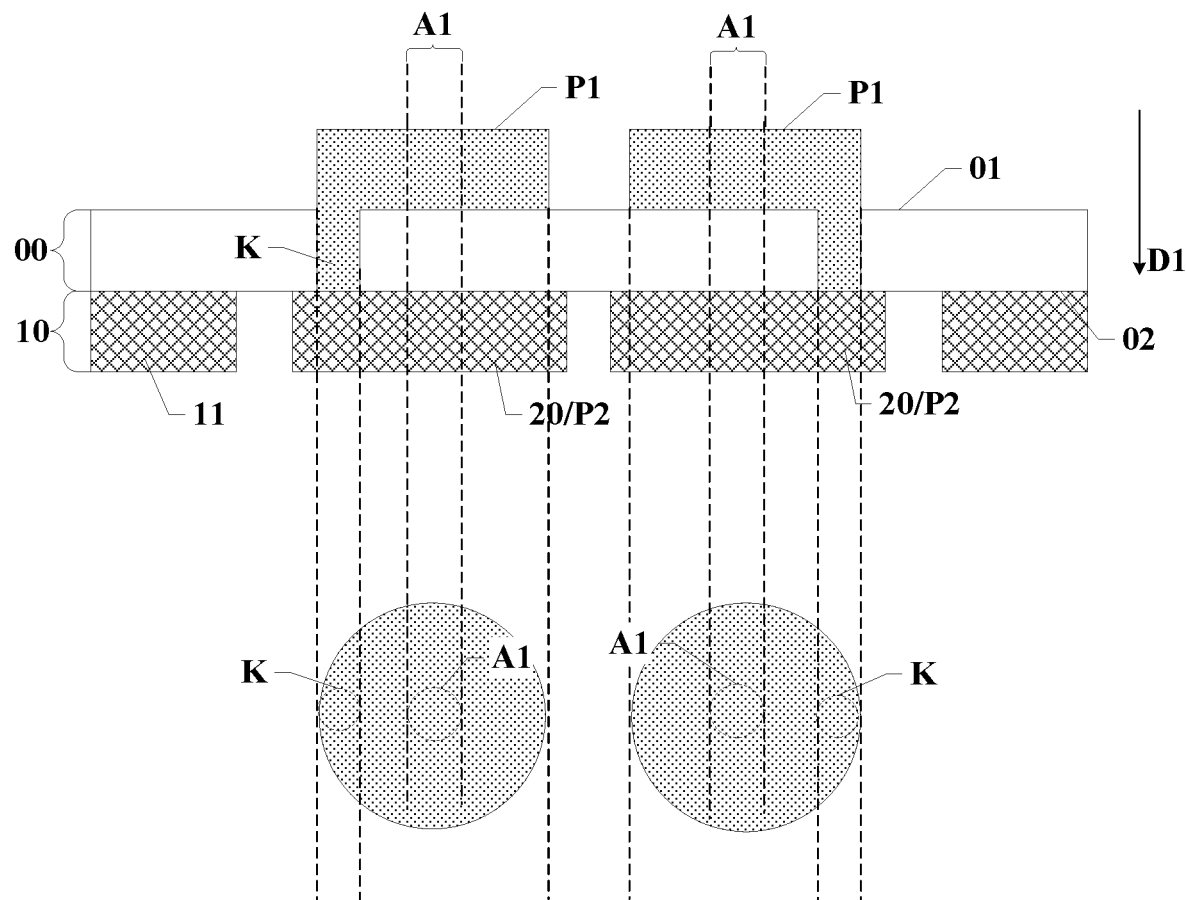
FIG. 8 illustrates another cross-section view of the circuit board along the A-A direction in FIG. 1, consistent with various disclosed embodiments in the present disclosure.

As shown in FIG. 8, in one embodiment, one of the auxiliary pads P2 may be electrically connected to a corresponding one of the test pads P1 through a conductive hole K. Along the first direction D1, the conductive hole K may penetrate through the base substrate 00.

FIG. 8 illustrates an implementation to electrically connect one of the auxiliary pads P2 to a corresponding one of the test pads P1 through a conductive hole K. As shown in FIG. 8, at a position corresponding to one of the test pads P1, a conductive hole K penetrating through the base substrate 00 may be formed on the base substrate 00, and the conductive hole K may be electrically connected to the test pad P1 and the auxiliary pad P2. Correspondingly, the test pad P1 and the auxiliary pad P2 may have an equipotential relationship, that is, the electrical signal on the auxiliary pad P2 may be consistent with the electrical signal on the test pad P1. When the probe penetrates through the test pad P1 and the base substrate 00, since the electrical signal on the auxiliary pad P2 in contact with the probe is consistent with the electrical signal of the test pad P1, this setting method may effectively prevent the impedance of the auxiliary pad P2 itself from affecting the bonding impedance of the circuit board. Further, the electrical signal on the auxiliary pad P2 may not affect the electrical signal of the probe, to improve the test accuracy of the bonding impedance of the circuit board.

As shown in FIG. 8, in one embodiment, the circuit board may include impedance test areas A1. The impedance test areas A1 may not overlap with the conductive vias K.

Along the first direction D1, each impedance test area A1 may be located in an overlapping area of a corresponding test pad P1 and a corresponding auxiliary pad P2. The impedance test area A1 may be the area where the probe is inserted into the test pad P1 or the auxiliary pad P2. In the embodiment shown in FIG. 8, the orthographic projection of the impedance test area A1 to the plane of the base substrate 00 may not overlap with the orthographic projection of the conductive hole K to the plane of the base substrate 00. When a probe is inserted into the impedance test area A1 for testing the bonding impedance, even if the probe pierces through the test pad P1 and the base substrate 00, the probe may be electrically connected to the auxiliary pad P2 and may not contact the conductive hole K. Therefore, the electrical connection between the test pad P1 and the auxiliary pad P2 may not be affected. The test accuracy of the bonding impedance may be effectively improved while avoiding the electrical connection between the probe and the metal structure 11.

Figure 9:
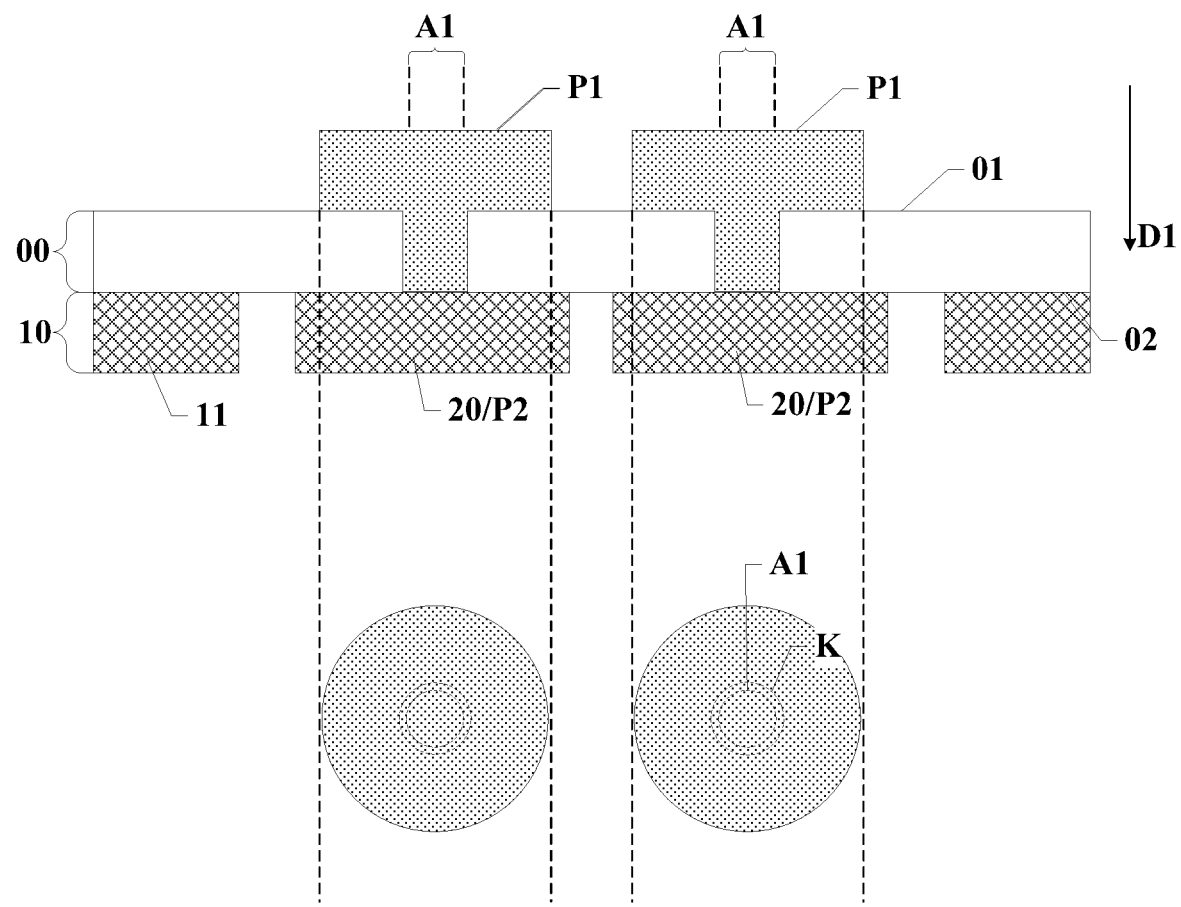
FIG. 9 illustrates another cross-section view of the circuit board along the A-A direction in FIG. 1, consistent with various disclosed embodiments in the present disclosure.
Figure 10:
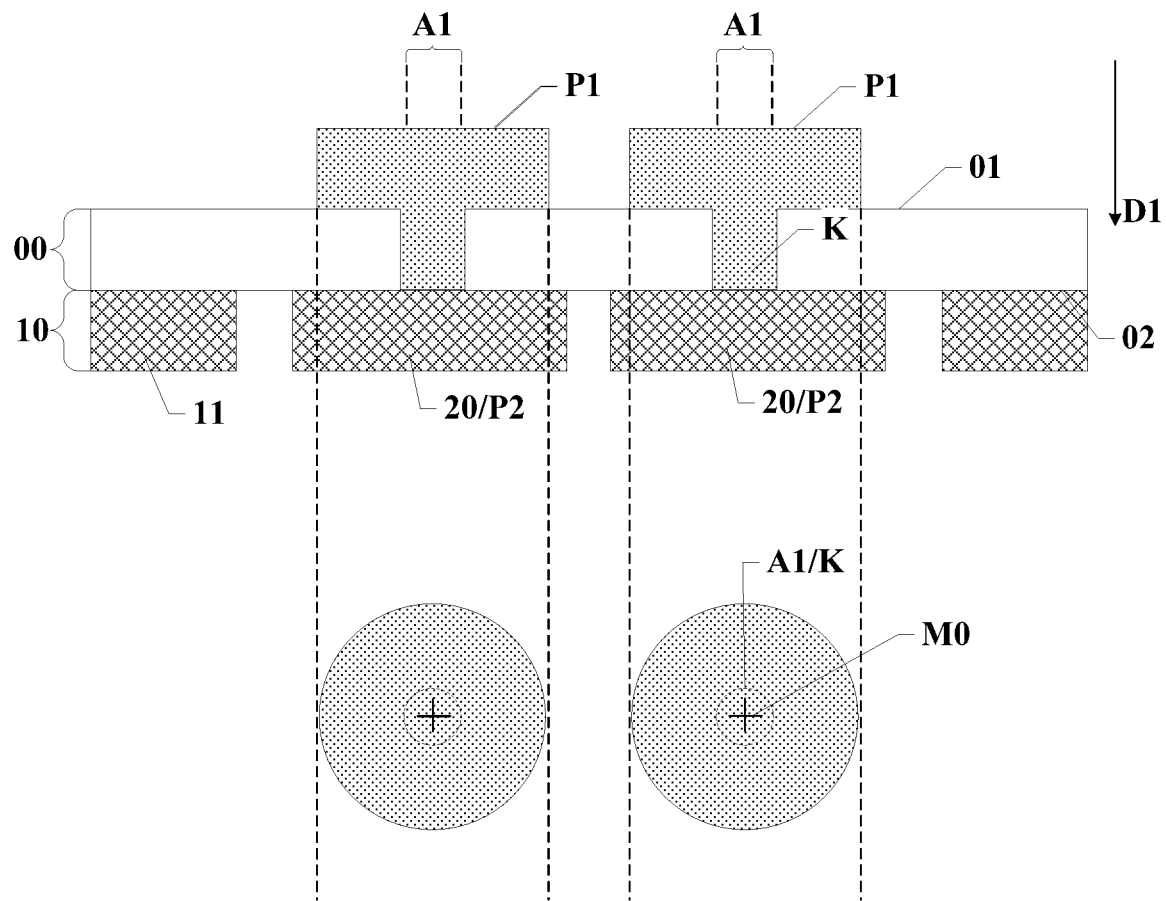
FIG. 10 illustrates another cross-section view of the circuit board along the A-A direction in FIG. 1, consistent with various disclosed embodiments in the present disclosure.

In another embodiment of the present disclosure shown in FIG. 9 and FIG. 10 which are another cross-sectional view of the circuit board in FIG. 1 along the AA direction, the impedance test areas A1 and the conductive vias K may have another positional relationship.

As shown in FIG. 9 and FIG. 10, in another embodiment, the circuit board may include impedance test areas A1.

Along the first direction, each impedance test area K may be located in an area limited by a corresponding conductive hole K. The impedance test area A1 may be the area where the probe is inserted into a corresponding test pad P1. Along the first direction D1, the impedance test area A1 may be located within the range limited by the conductive hole K. That is, along the first direction D1, the orthographic projection of the impedance test area A1 to the plane of the base substrate 00 may be located within the orthographic projection range of the corresponding conductive hole K to the plane of the base substrate 00, and the area of the orthographic projection of the impedance test area A1 to the plane where the base substrate 00 is located may be smaller than the area of the orthographic projection of the conductive hole K to the plane where the base substrate 00 is located, as shown in FIG. 9; or the orthographic projection of the impedance test area A1 to the plane of the base substrate 00 may coincide the orthographic projection range of the corresponding conductive hole K to the plane of the base substrate 00, as shown in FIG. 10. Therefore, when the probe is inserted into the test pad P1 from the impedance test area A1, the probe may further extend from the conductive hole K to the direction of the auxiliary pad P2 as the depth of the probe is increased, and the conductive hole K may play a certain guiding role in the direction of the probe. When the conductive hole K is pierced, the probe may contact the auxiliary pad P2. Since the auxiliary pad P2 and the test pad P1 are equipotential, and the auxiliary pad P2 and the metal structure 11 are insulated from each other, the contact between the probe and the metal structure 11 may be effectively avoided and the signal of the metal structure 11 may be prevented from affecting the test result of the bonding impedance. Further, the equipotential design of the auxiliary pad P2 and the test pad P1 may not affect the bonding impedance, which may be beneficial to improving the testing accuracy of the bonding impedance.

As shown in FIG. 8 to FIG. 10, when the test pads P1 and the auxiliary pads P2 are electrically connected through the conductive vias K, each of the test pads P1 and a corresponding one of the auxiliary pads P2 may be equipotential. Therefore, the probe may be inserted from the test pads P1 side for test of the bonding impedance, and may also be inserted from one side of the auxiliary pads P2 for test of the bonding impedance. That is, the test pads P1 and the auxiliary pads P2 may be used to test the bonding impedance. When the test pads P1 are damaged, the auxiliary pads P2 may also be used for testing, ensuring the effectiveness of the bonding impedance test. The flexibility of the bonding impedance test of the circuit board may be improved. Further, even if the test pads P1 are damaged, the auxiliary pads P2 may be used for measurement, and there may be no need to define the circuit board as a defective product, which is beneficial to improve the yield of the circuit board.

In one embodiment shown in FIG. 10, each impedance test area A1 may include a positioning mark M0. The positioning mark M0 may be located on the surface of a corresponding test pad P1 away from the base substrate 00, and/or the positioning mark M0 may be located on the surface of a corresponding auxiliary pad P2 away from the base substrate 00.

Specifically, in the present embodiment, a positioning mark M0 may be set in each impedance test area A1. The positioning mark M0 may be used for guidance to determine the penetration area of the probe on the corresponding test pad P1. Optionally, along the first direction D1, the positioning mark M0 may overlap with the corresponding auxiliary pad P2, and may be located within the range limited by the corresponding auxiliary pad P2. The probe may be inserted into the corresponding test pad P1 from the position where the positioning mark M0 is located. When piercing through the test pad P1 and the base substrate 00, the probe may accurately contact the auxiliary pad P2 and avoid contact with the metal structure 11. Therefore, the introduction of the positioning mark M0 may be beneficial to improve the test accuracy of the bonding impedance.

Optionally, the positioning mark M0 in the embodiment of the present disclosure may, for example, be embodied as a convex structure or a concave structure disposed on the circuit board, and the shape of the convex structure or the concave structure may be defined according to actual requirements. For example, the shape may be set as a circle, a triangle, a cross, or any other feasible shapes.

Figure 11:
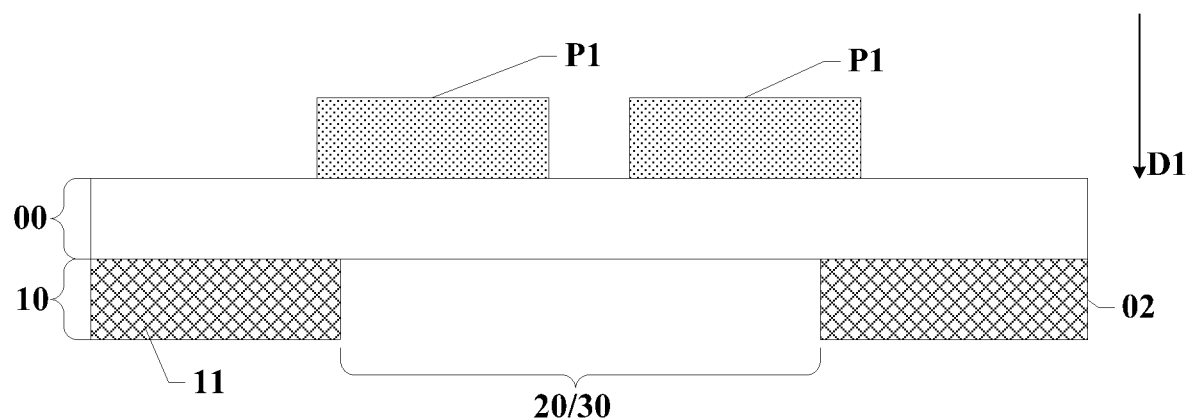
FIG. 11 illustrates another cross-section view of the circuit board along the A-A direction in FIG. 1, consistent with various disclosed embodiments in the present disclosure.

In the previous embodiments, the test auxiliary structure 20 may be implemented as the auxiliary pads P2. In other embodiments, the test auxiliary structures 20 may be implemented as other structures. FIG. 11 shows another cross-sectional view of the circuit board in FIG. 1 along the AA direction, provided by another embodiment.

As shown in FIG. 11, in one embodiment, the test auxiliary structure 20 may include a hollowed area 30, and there may be no gap between the hollowed area 30 and the metal structure 11.

The hollowed area 30 may be regarded as an area formed by removing part of the metal structure 11 of the metal layer 10 under the test pads P1. Along the first direction D1, the test pads P1 and the hollowed area 30 may overlap. When the probe is inserted into the test pads P1 to test the bonding impedance of the circuit board, even if the probe penetrates through the test pads P1 and the base substrate 00, the probe may penetrate into the hollowed area 30 without contact with the charged metal structure 11. Therefore, the electrical signal on the metal structure 11 may not be transmitted to the probe, and may not affect the test accuracy of the bonding impedance of the circuit board. In the actual manufacturing process, only the part of the metal structure 11 corresponding to the test pads P1 may need to be removed, no new film layer structure may not need to be introduced. The manufacturing process may be simple, and the thinning requirement of the circuit board may be met.

In one embodiment shown in FIG. 11, the circuit board may at least include two test pads P1 insulated from each other. The two test pads P1 may correspond to one same hollowed area 30.

FIG. 11 illustrates the implementation where the two test pads P1 may correspond to one same hollowed area 30. Therefore, even when two probes corresponding to the two test pads P1 penetrate through the base substrate 00, the two probes may penetrate into the hollowed area 30, without contact with the charged metal structure 11. Therefore, the electrical signal on the metal structure 11 may not be transmitted to the probe, and may not affect the test accuracy of the bonding impedance of the circuit board. By setting the two test pads P1 corresponding to one same hollowed area 30, the design process may be simple and the production efficiency may be improved.

Figure 12:
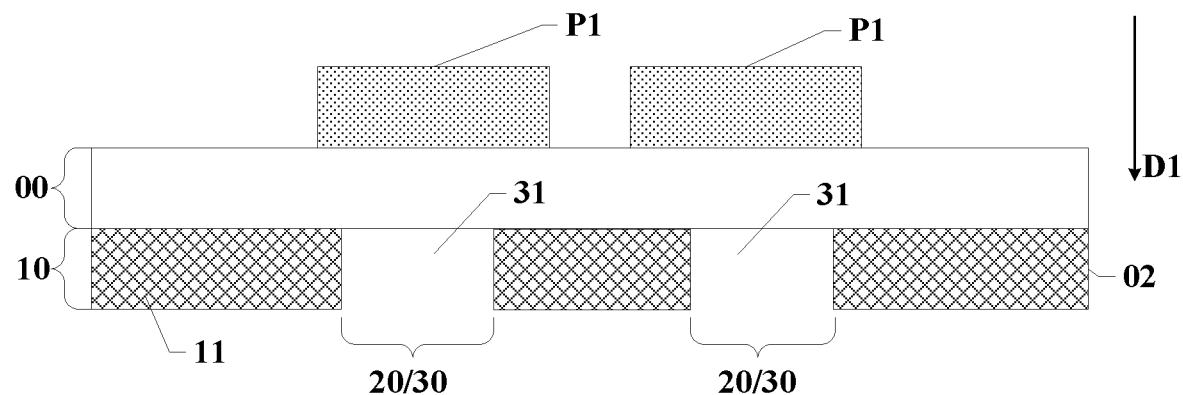
FIG. 12 illustrates another cross-section view of the circuit board along the A-A direction in FIG. 1, consistent with various disclosed embodiments in the present disclosure.

In one embodiment shown in FIG. 12, the circuit board may at least include two test pads P1 insulated from each other. The two test pads P1 may correspond to different hollowed areas 30 respectively.

FIG. 12 illustrates the implementation where the two test pads P1 may correspond to two different hollowed areas 30 respectively. Therefore, even when two probes corresponding to the two test pads P1 penetrate through the base substrate 00, the two probes may penetrate into different hollowed areas 30, without contact with the charged metal structure 11. Therefore, the electrical signal on the metal structure 11 may not be transmitted to the probe, and may not affect the test accuracy of the bonding impedance of the circuit board. Further, a non-hollowed structure, such as the metal structure 11, may be provided between the two hollowed areas 30 corresponding to the two test pads P1, and the metal structure may also play a supporting role on the base substrate, to avoid the low support force caused by the excessive hollowed range.

Figure 13:
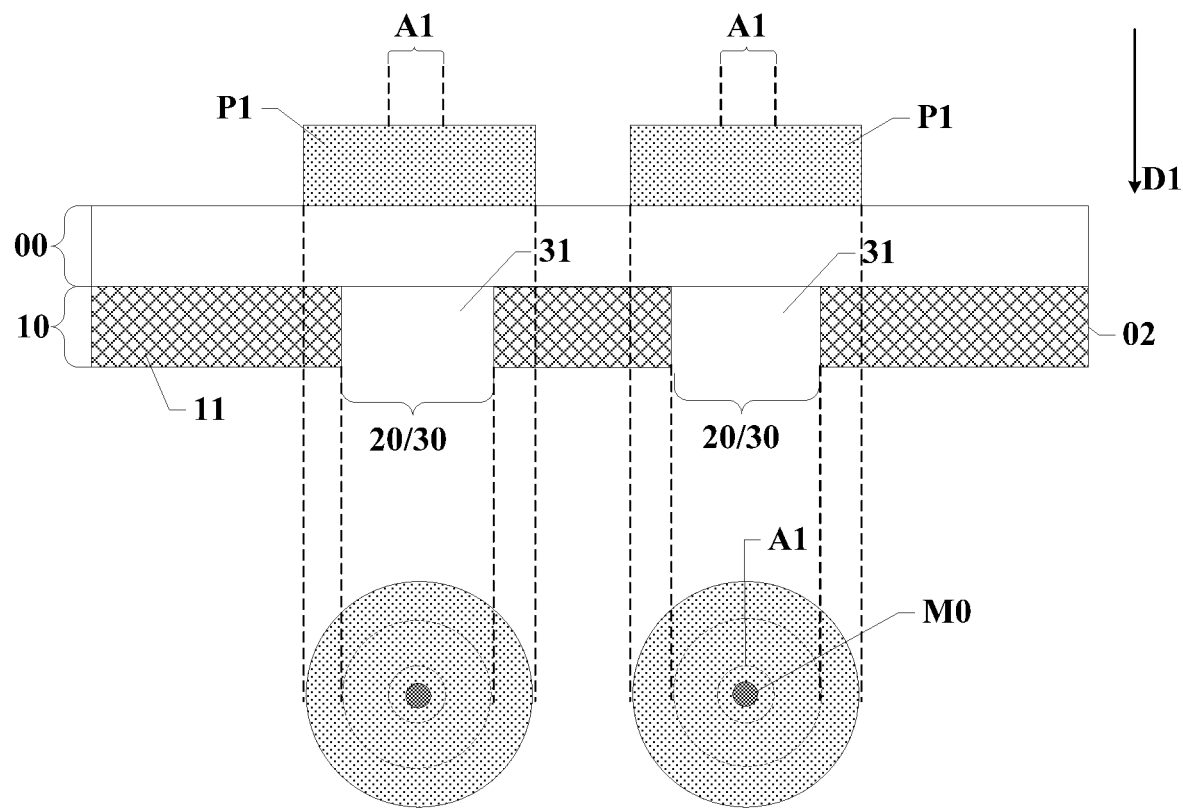
FIG. 13 illustrates another cross-section view of the circuit board along the A-A direction in FIG. 1, consistent with various disclosed embodiments in the present disclosure.

In one embodiment shown in FIG. 13 which is another cross-sectional view of the circuit board in FIG. 1 along the AA direction, each hollowed area 30 may include a hollowed part 31. Along the first direction D1, the hollowed part 31 may penetrate through the metal layer 11, and may be located with a range limited by a corresponding test pad P1.

In the embodiment shown in FIG. 13, each hollowed area 30 may include one hollowed part 31. That is, there may be no other film layer structure in an area corresponding to the hollowed area 30, and the hollowed area 30 may have a hollowed structure penetrating through the metal layer 11. The hollowed part 31 may be located with a range limited by a corresponding test pad P1. Therefore, when the probe penetrates through the corresponding test pad P1 and the base substrate 00, the probe may be floated in the hollowed part 31, without contact with the charged metal structure 11. The hollowed part 31 may have no impedance and may not affect the bonding impedance. The test accuracy of the bonding impedance of the circuit board may be improved.

That the hollowed part 31 may be located with a range limited by a corresponding test pad P1, may mean that, along the first direction D1, the orthographic projection of the hollowed part 31 to the plane of the base substrate 11 may coincide with the orthographic projection of the test pad P1 to the plane of the base substrate; or the orthographic projection of the hollowed part 31 to the plane of the base substrate 11 may be located within the range of the orthographic projection of the test pad P1 to the plane of the base substrate and the size of the hollowed part 31 may be smaller than the size of the test pad P1. Therefore, while avoiding the contact between the probe and the metal structure, the size of the hollowed part 31 may not be too large, which may also be beneficial to improve the support performance of the metal layer 10 to the base substrate 00.

As shown in FIG. 13, in one embodiment, the circuit board may include impedance test areas A1. Along the first direction, each impedance test area A1 may be located in an overlapping area of a corresponding test pad P1 and a corresponding hollowed area 30, and may be within a range limited by the corresponding hollowed area 30.

The impedance test area A1 may refer to an area where the probe is inserted into the corresponding test pad P1. In the present embodiment, the impedance test area A1 may be located in the overlapping area of the corresponding test pad P1 and the corresponding hollowed area 30, and the orthographic projection of the impedance test area A1 on the plane where the base substrate 00 is located may be set within the range of the orthographic projection of the corresponding hollowed area 30 on the plane where the base substrate 00 is located. Therefore, when the probe is inserted into the corresponding test pad P1 from the impedance test area A1, even if the probe penetrates through the test pad P1 and the base substrate 00, the area where the probe reaches may be also the area where the corresponding hollowed area 30 is located. The contact between the probe and the metal structure 11 may be avoided. Since there is no impedance in the hollowed area 30, the test accuracy of the bonding impedance may be improved.

In one embodiment, each impedance test area A1 may include a positioning mark M0, and the positioning mark M0 is located on the surface of a corresponding test pad P1 away from the base substrate 00.

Specifically, in the present embodiment, one positioning mark M0 may be set on the surface of one corresponding test pad P1 away from the base substrate 00. The positioning mark M0 may be used for guidance to determine the penetration area of the probe on the corresponding test pad P1. Optionally, along the first direction D1, the positioning mark M0 may overlap one corresponding hollowed area 30, and may be set within the range limited by the corresponding hollowed area 30. When the probe is inserted into the corresponding test pad P1 from the position of the positioning mark M0, even if the test pad P1 and the base substrate 00 are penetrated through, the probe may accurately penetrate into the corresponding hollowed area 30, avoiding the contact with the metal structure 11. Therefore, the introduction of the positioning mark M0 may be beneficial to improve the test accuracy of the bonding impedance.

Optionally, the positioning mark M0 may be embodied as, for example, a convex structure or a concave structure disposed on the circuit board. Of course, in some other embodiments of the present disclosure, the positioning mark may also be embodied as a plane structure. That is, the structure with the same thickness as the film layer, etc., which is not specifically limited in the present invention, in addition, the shape of the positioning mark can be limited according to actual needs.

Figure 14:
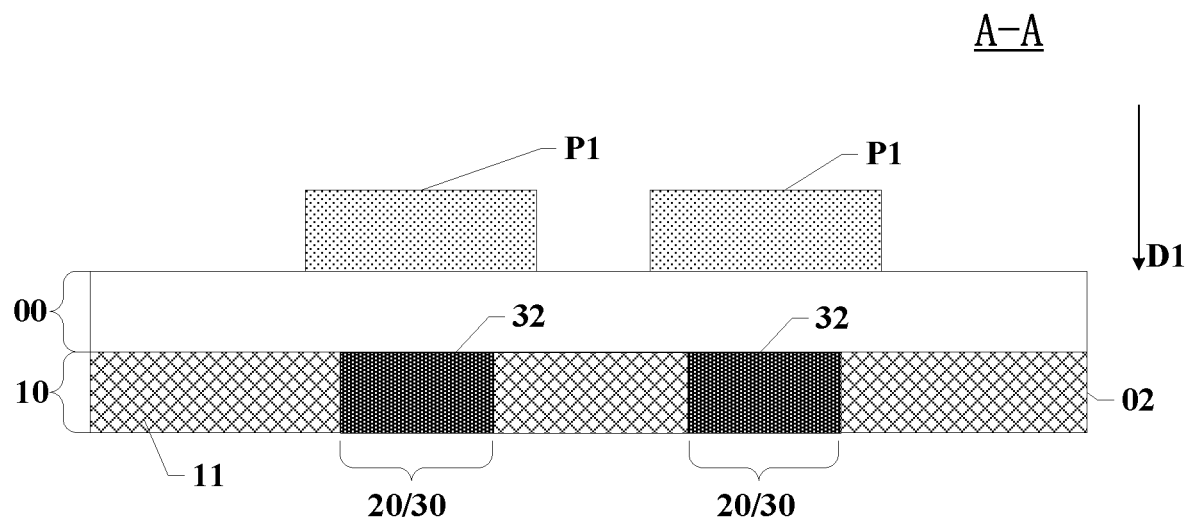
FIG. 14 illustrates another cross-section view of the circuit board along the A-A direction in FIG. 1, consistent with various disclosed embodiments in the present disclosure.

In another embodiment shown in FIG. 14 which is another cross-sectional view of the circuit board in FIG. 1 along the AA direction, each hollowed area 30 in the metal layer 10 may be filled with an insulating layer 32.

As shown in FIG. 14, each hollowed area 30 in the metal layer 10 may be filled with an insulating layer 32. A surface of the insulating layer 32 away from the base substrate 00 may be flush with the surface of the metal layer 10 away from the base substrate 00.

In the present disclosure, one hollowed area 30 may be disposed at a position in the metal layer 10 corresponding to a corresponding test pad P1, and the hollowed area 30 may be filled with one insulating layer 32. When the probe penetrates through the test pad P1 and the base substrate 00, the probe may penetrate into the insulating layer 32. There may be no electrical signals in the insulating layer, and the test signal on the probe may not be affected. Therefore, the influence of the contact between the probe and the charged metal structure 11 on the test result may be avoided, and the test accuracy of the bonding impedance may be improved.

Figure 15:
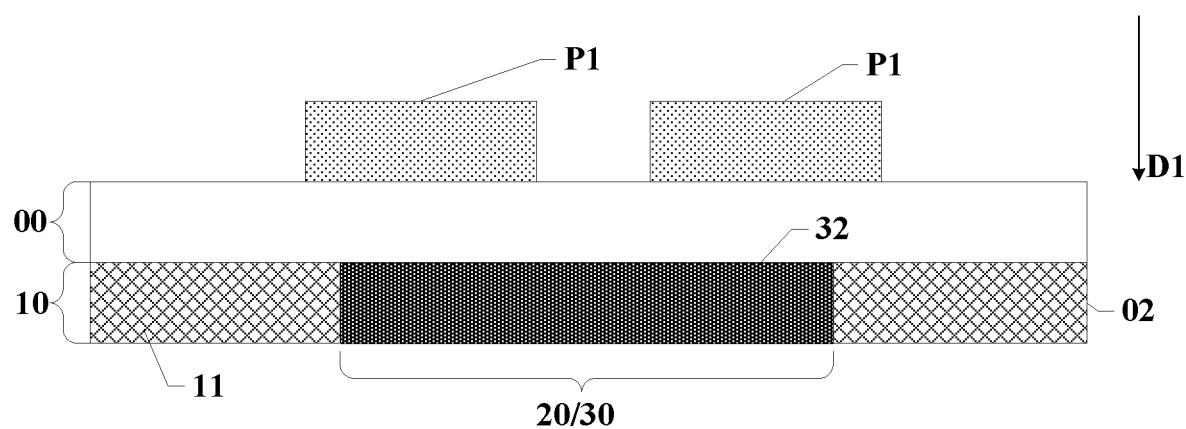
FIG. 15 illustrates another cross-section view of the circuit board along the A-A direction in FIG. 1, consistent with various disclosed embodiments in the present disclosure.

In one embodiment shown in FIG. 15 which is another cross-sectional view of the circuit board in FIG. 1 along the AA direction, there may be two test pads P1 corresponding to one same insulating layer 32, and the hollowed area 30 may be filled with the insulating layer 32. The insulating layer may not conduct. Therefore, when two probes penetrate through the test pads P1 and the base substrate 00, the probes may penetrate into a position of the insulating layer 32. Therefore, the influence of the contact between the probe and the charged metal structure 11 on the test result may be avoided, and the test accuracy of the bonding impedance may be improved.

As shown in FIG. 14 and FIG. 15, when each hollowed area 30 is filled with one insulating layer 32, a surface of the insulating layer 32 away from the base substrate 00 may be flush with the surface of the metal layer 10 away from the base substrate 00. That is, the insulating layer 32 and the metal layer 10 may be flush on a side away from the base substrate 100. Therefore, the base substrate 00 may be supported well and the deformation of the circuit board when the probes are inserted into the circuit board to press the circuit board may be avoided.

In one embodiment, the insulating layer 32 may be made of a material including ink. Ink is a common insulating material in the process of making circuit boards. The present embodiment may use ink to fill the hollowed area 30 without introducing new materials into the circuit board. Costs may be reduced and the production process may be simplified.

Figure 16:
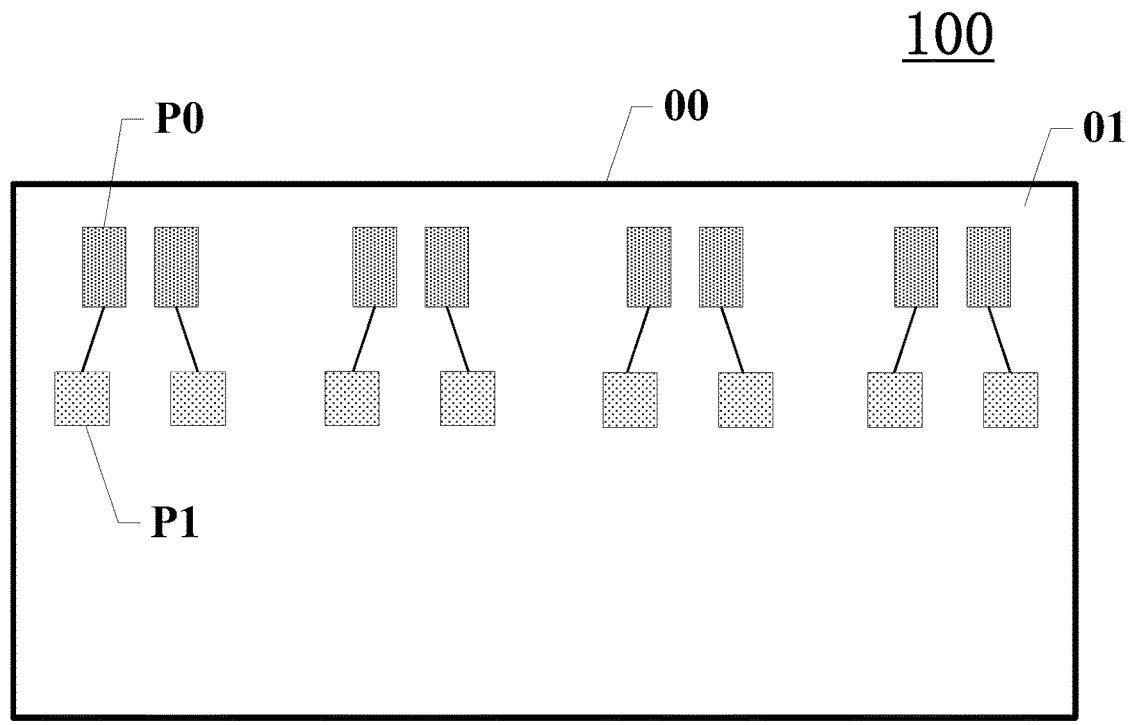
FIG. 16 illustrates another top view of a first surface of an exemplary circuit board consistent with various disclosed embodiments in the present disclosure.
Figure 17:
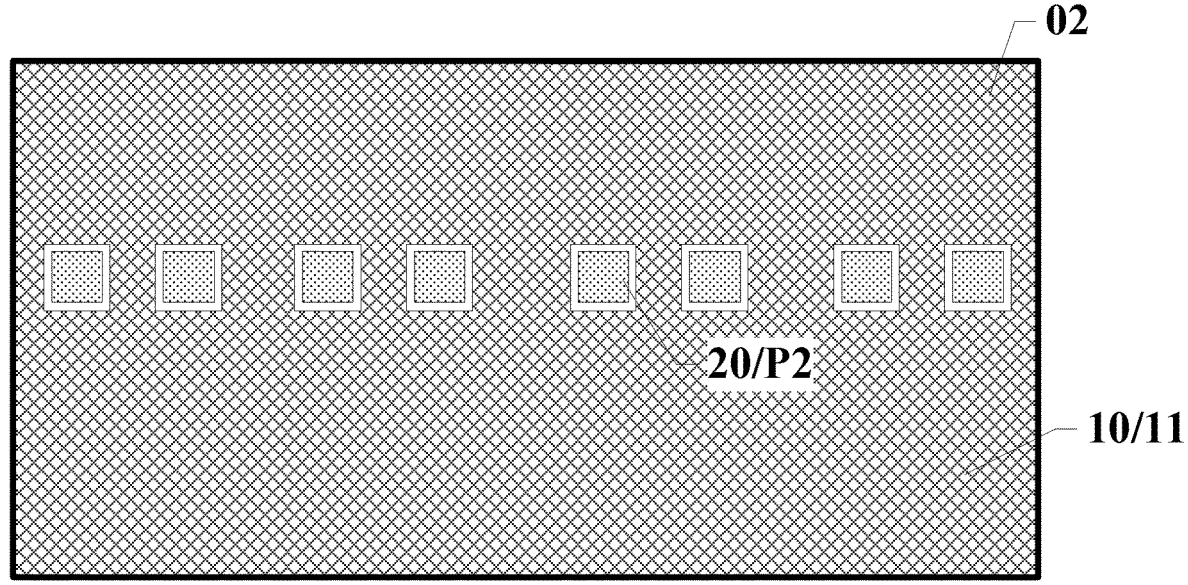
FIG. 17 illustrates another top view of a second surface of an exemplary circuit board consistent with various disclosed embodiments in the present disclosure.

In some embodiments, the test pads P1 and the test auxiliary structure 20 may have a circular structure shown in FIG. 1 and FIG. 2. In some other embodiments, the test pads P1 and the test auxiliary structure 20 may have a square structure shown in FIG. 16 and FIG. 17. FIG. 16 is a top view of the first surface 01 of the circuit board, and FIG. 17 is a top view of the second surface 02 of the circuit board. In one embodiment shown in FIG. 16 and FIG. 17, the test pads P1 and the test auxiliary structure 20 may have a square structure. In some other embodiments, the test pads P1 and the test auxiliary structure 20 may have any other suitable structure. In the embodiment shown in FIG. 16 and FIG. 17, the test pads P1 and the test auxiliary structure 20 disposed correspondingly may have same structures. In some other embodiments, the test pads P1 and the test auxiliary structure 20 disposed correspondingly may have different structures. The present disclosure has no limit on this.

Figure 18:
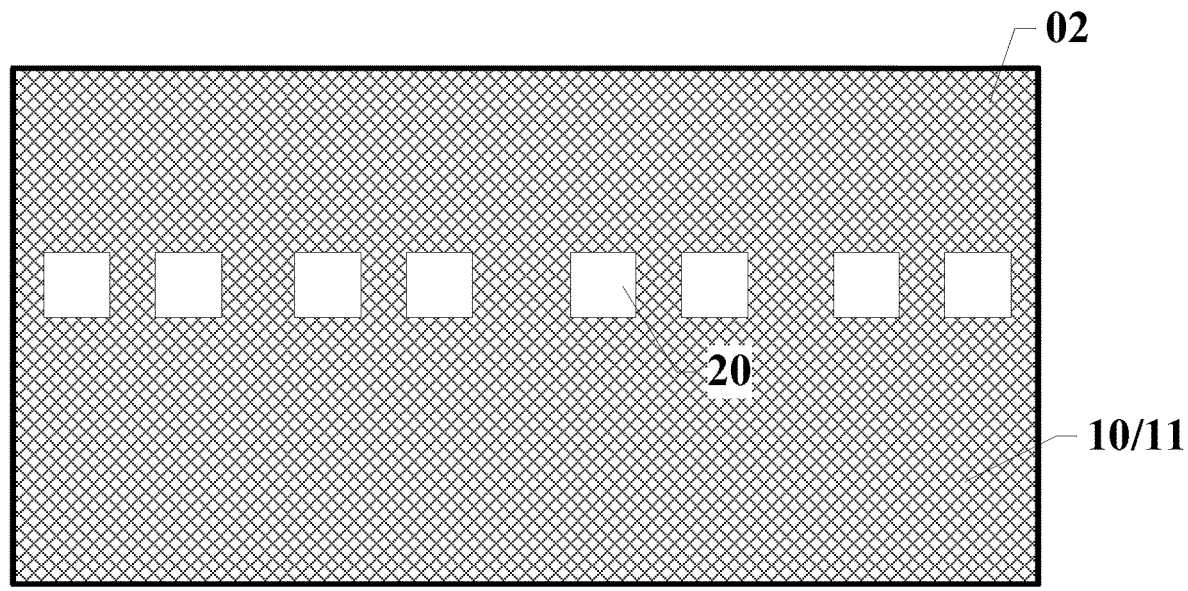
FIG. 18 illustrates another top view of a second surface of an exemplary circuit board consistent with various disclosed embodiments in the present disclosure.

When the hollowed areas on the metal layer 02 are not filled with the insulating layers, the test auxiliary structure 20 may correspond to the hollowed areas 30, and the top view of the second surface 02 of the circuit board may refer to the structure shown in FIG. 18. The shape of the hollowed areas 30 may be embodied in any structures, such as squares, circles, or ellipses.

Figure 19:
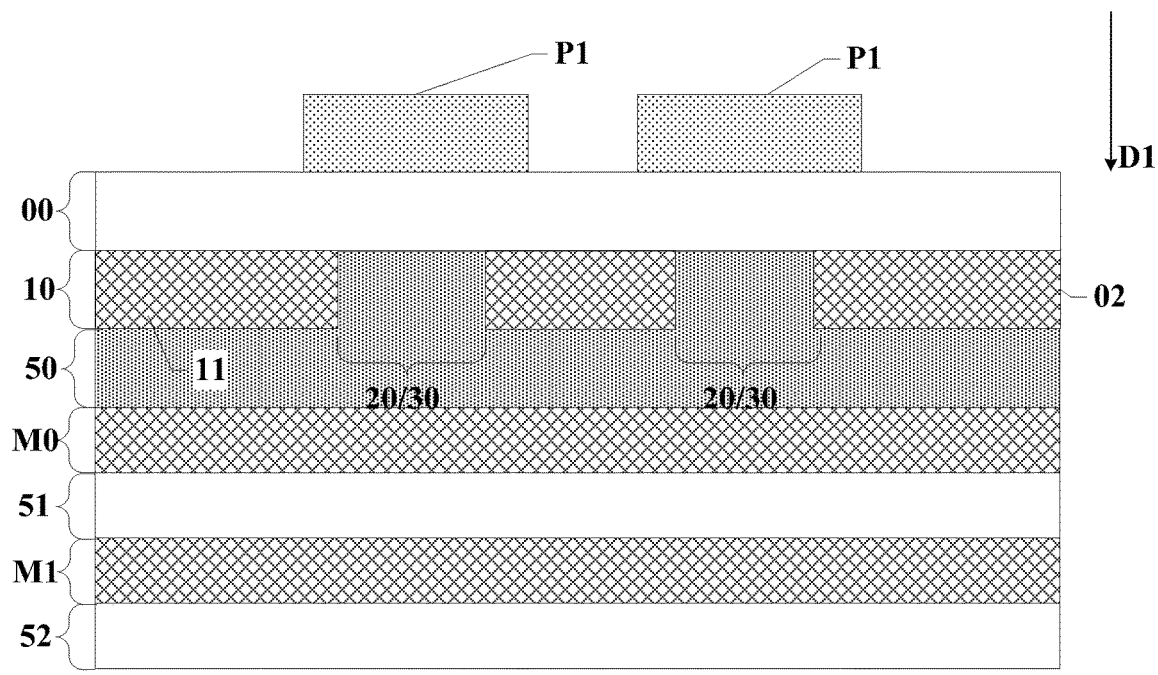
FIG. 19 illustrates another cross-section view of the circuit board along the A-A direction in FIG. 1, consistent with various disclosed embodiments in the present disclosure.

The previous embodiments where one metal layer 10 is provided on a side of the base substrate 100 away from the test pads P1 are used as examples only to illustrate the present disclosure, and do not limit the scope of the present disclosure. In some other embodiments, one or more layers of other metal film layers may be provided on a side of the metal layer 10 away from the base substrate 00. For example, in one embodiment shown in FIG. 19 which is another cross-sectional view of the circuit board in FIG. 1 along the AA direction, two metal film layers M0 and M1, and three insulating layers 50, 51 and 52, may be further provided on the side of the metal layer 10 away from the base substrate 00. In one embodiment, along the first direction, two adjacent metal film layers may be separated by a corresponding insulating layer, and the metal layer 10 and the metal film layer M0 may be insulated and separated by the insulating layers 50. When the test auxiliary structure 20 includes the hollowed areas 30, the hollowed areas may be filled with the insulating layers 50 adjacent to the metal layer 10. Therefore, there may be no need to introduce a new film layer structure in the circuit board, which may improve the test accuracy of the bonding impedance of the circuit board and also facilitate the simplification of the manufacturing process. The overall thickness of the circuit board may not increase.

In one embodiment, when the test auxiliary structure includes auxiliary pads, the first space between the auxiliary pads and the metal structure and the spaces between adjacent auxiliary pads may also be filled with the insulating layers adjacent to the metal layer. The present disclosure has no limit on this.

The present disclosure also provides a display module. In one embodiment shown in FIG. 20 which is a top view of the display module, the display module 200 may include a display panel 300 and a circuit board 100 provided by various embodiments of the present disclosure. The display panel 300 may include a bonding area 301 and the circuit board 100 may be bonded to the bonding area 301 through the bonding pads.

The circuit board may be provided with test pads and test auxiliary structure corresponding to the test pads. Therefore, When the bonding impedance of the circuit board on the display panel is tested by piercing the test pads with the probe, even if the probe pierces through the test pads and the base substrate, the probe may contact the test auxiliary structure without contacting the metal structure. The electrical signal on the metal structure may not affect the test of the bonding impedance, and the test accuracy of the bonding impedance of the circuit board may be improved.

The implementation of the display module may refer to the previous embodiments of the circuit board. The display panel may be an organic electroluminescence display panel, a mini-LED display panel or a micro-LED display panel.

Figure 20:
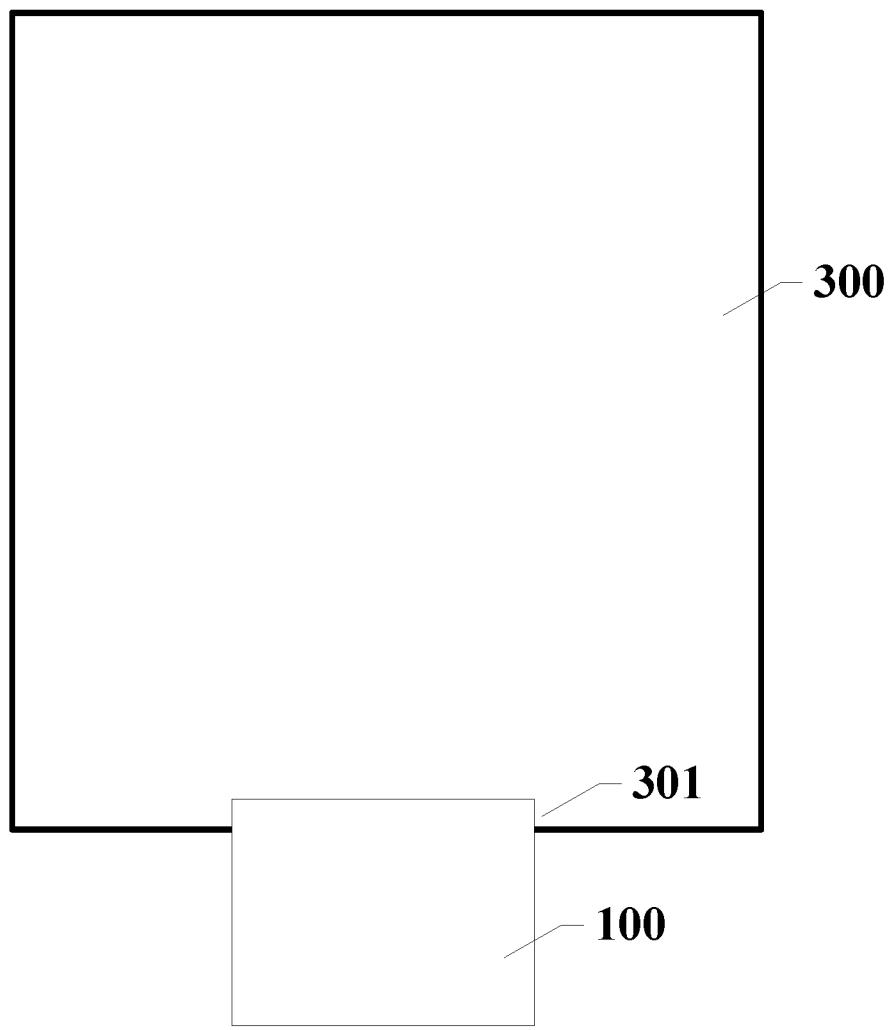
FIG. 20 illustrates a top view of an exemplary display module consistent with various disclosed embodiments in the present disclosure.
Figure 21:
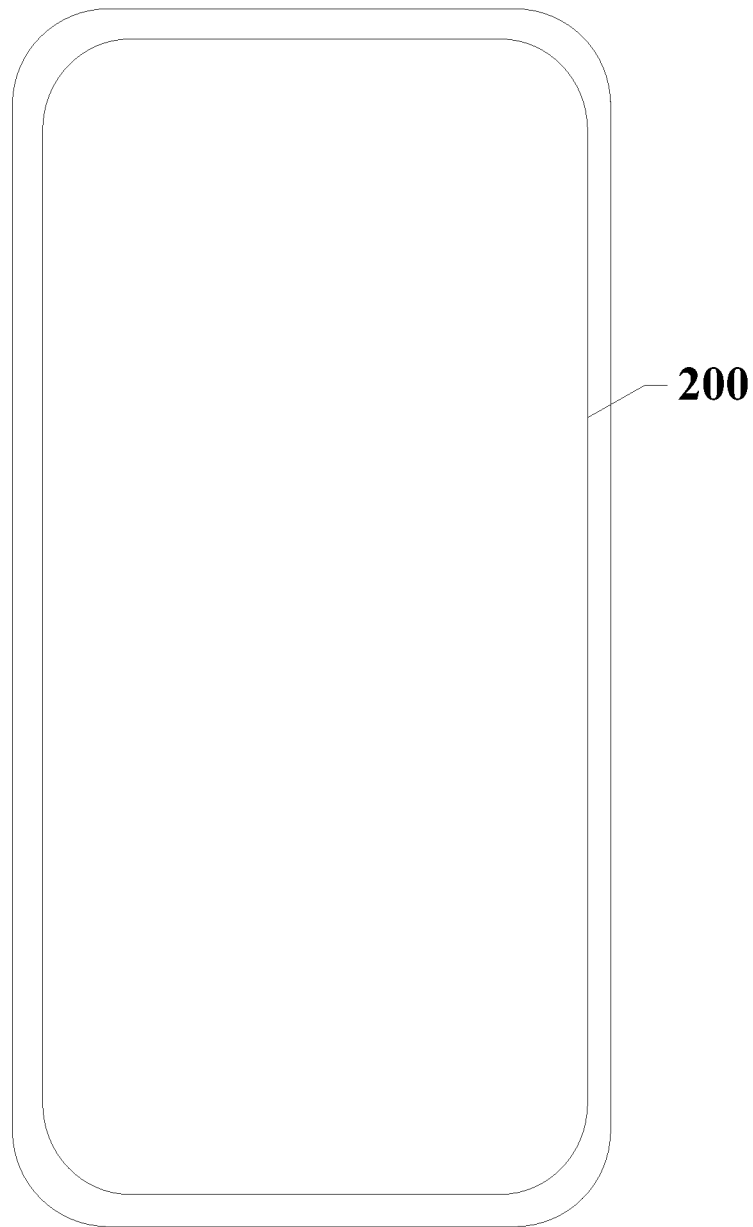
FIG. 21 illustrates a top view of an exemplary display device consistent with various disclosed embodiments in the present disclosure.

The present disclosure also provides a display device. In one embodiment shown in FIG. 21 which is a top view of the display device, the display device 400 may include a display module provided by various embodiments of the present disclosure. By introducing a test auxiliary structure on the circuit board, the test accuracy of the bonding impedance of the circuit board may be improved, thereby helping to improve the performance stability of the display device including the circuit board and the display panel. When the display module shown in FIG. 20 is used to form the display device, the circuit board may be folded back to the non-light-emitting surface of the display panel, to realize the narrow frame design of the display device.

The implementation of the display device may refer to the previous embodiments of the circuit board and the display module. The display device in various embodiments may be a cell phone, a tablet, a television, a monitor, a laptop, a digital album, a navigator, or other products or parts with display functions.

In the present disclosure, in the circuit board, the bonding pads and the test pads electrically connected to the bonding pads may be provided on the first surface of the base substrate. Optionally, the bonding pads may be used for bonding with the display panel. Through the test pads, the bonding impedance of the circuit board may be measured. The metal layer and the test auxiliary structure insulated from the metal layer may be disposed on the second surface of the base substrate. Along the first direction, the test auxiliary structure and the test pads may overlap. When using the probe to penetrate the test pads to test the bonding impedance of the circuit board, since the test auxiliary structure is disposed directly under the test pads, even if the probe penetrates through the test pads and the base substrate and contact the test auxiliary structure, since the testing auxiliary structure is insulated from the metal structure on the metal layer, the electrical signal on the metal structure may not affect the test impedance. Therefore, the test accuracy of the bonding impedance of the circuit board when the circuit board is bound to the display panel may be improved.

In the display module and the display device provided by the present disclosure, the circuit board may be bonded on the display panel. Since the test auxiliary structure is introduced into the circuit board, the test accuracy of the bonding impedance on the display surface may be improved and whether the display module is qualified or not may be determined by the bonding impedance, which may be beneficial to improve the accuracy of the yield detection of the display module and the display device.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A circuit board, comprising:
   a base substrate including a first surface and a second surface opposite to each other;
   bonding pads on the first surface;
   test pads electrically connected to the bonding pads and disposed on the first surface;
   a test auxiliary structure on the second surface, wherein the test auxiliary structure overlaps with the test pads along a first direction and the first direction is perpendicular to the first surface and the second surface of the base substrate; and
   a metal layer on the second surface, wherein the metal layer includes a metal structure for transmitting an electrical signal capable of affecting a test signal used for testing a bonding impedance of the circuit board, and the test auxiliary structure is insulated from the metal structure, wherein:
   the test auxiliary structure includes hollowed areas, and no gaps are between the hollowed areas and the metal structure;
   each hollowed area includes a hollowed part; and
   along a first direction, the hollowed part penetrates through the metal layer and is located within a range limited by a corresponding one of the test pads.

2. The circuit board according to claim 1, wherein:
   the test auxiliary structure and the metal layer are disposed in one same layer.

3. The circuit board according to claim 1, wherein:
   the test pads in the circuit board include at least two test pads that are insulated from each other and the at least two test pads correspond to different hollowed areas respectively.

4. The circuit board according to claim 1, wherein:
   the circuit board includes an impedance test area; and
   along the first direction, the impedance test area is located within an overlapping area of the test pads and the hollowed areas, and is located in a range limited by the hollowed areas.

5. The circuit board according to claim 4, wherein:
   the impedance test area includes positioning marks; and
   the positioning marks are located on surfaces of the test pads away from the base substrate.

6. A display module, comprising a display panel and the circuit board of claim 1.

* * * * *